(12) United States Patent
Xu

(10) Patent No.: US 11,816,449 B2
(45) Date of Patent: Nov. 14, 2023

(54) LOW-LOSS ARITHMETIC CIRCUIT AND OPERATING METHOD OF THE SAME

(71) Applicant: NeoNexus Pte. Ltd., Singapore (SG)

(72) Inventor: Zhenlong Xu, Singapore (SG)

(73) Assignee: NEONEXUS PTE. LTD., Singapore (SG)

( * ) Notice: Subject to any disclaimer, the term of this patent is extended or adjusted under 35 U.S.C. 154(b) by 344 days.

(21) Appl. No.: 17/356,743

(22) Filed: Jun. 24, 2021

(65) Prior Publication Data

US 2022/0334803 A1 Oct. 20, 2022

Related U.S. Application Data

(63) Continuation of application No. PCT/CN2021/087703, filed on Apr. 16, 2021.

(51) Int. Cl.
*G06F 7/57* (2006.01)
*H03K 19/21* (2006.01)

(52) U.S. Cl.
CPC ............. *G06F 7/57* (2013.01); *H03K 19/215* (2013.01)

(58) Field of Classification Search
CPC ...... G06F 7/57; G06F 7/5443; G06F 15/7821; G11C 7/1006; G11C 11/54; H03K 19/20
See application file for complete search history.

(56) References Cited

U.S. PATENT DOCUMENTS

| 10,958,272 B2 * | 3/2021 | Shu ........................ G11C 7/06 |
| 2009/0141566 A1 * | 6/2009 | Arsovski .............. G11C 7/1006 |
| | | 365/189.15 |
| 2018/0315473 A1 * | 11/2018 | Yu ........................... G06N 3/04 |

FOREIGN PATENT DOCUMENTS

EP    3671748 A1 *   6/2020

OTHER PUBLICATIONS

Yeap, Kim Ho & Nisar, Humaira, "Introductory Chapter: VLSI" from Very-Large-Scale Integration, Intech, 2018, available from: http://dx.doi.org/10.5772/intechopen.69188 (Year: 2018).*
electronicsforu.com, "Electronics and Electrical Symbols", Feb. 2021, retrieved from https://www.electronicsforu.com/technology-trends/learn-electronics/electronics-and-electrical-symbols (Year: 2021).*

* cited by examiner

*Primary Examiner* — Matthew D Sandifer
(74) *Attorney, Agent, or Firm* — Bayes PLLC

(57) ABSTRACT

The disclosure relates to a low-loss arithmetic circuit, which includes a plurality of arithmetic units, a plurality of storage units, and one or more reset MOSFETs. Each arithmetic unit includes 4 MOSFETs. The disclosure also relates to an operating method of the low-loss arithmetic circuit and a low-loss Processing-in-Memory circuit.

12 Claims, 5 Drawing Sheets

US 11,816,449 B2

LOW-LOSS ARITHMETIC CIRCUIT AND OPERATING METHOD OF THE SAME

CROSS REFERENCE TO RELATED APPLICATION

This application is continuation of International Application No. PCT/CN2021/087703, filed on Apr. 16, 2021, which is hereby incorporated by reference in its entirety.

BACKGROUND

The present disclosure generally relates to the field of integrated circuits, and specifically, to a low-loss arithmetic circuit and operating method of the same. In addition, the disclosure also relates to a low-loss Processing-in-Memory circuit.

The Processing-in-Memory chip refers to a chip that performs calculations in or near the memory. Due to the advantages of lower power consumption and smaller chip area, Processing-in-Memory chips are drawing more and more attention in the industry.

However, the current Processing-in-Memory chip still has room for further improvement in aspects of quantization error and power loss.

SUMMARY

The object of the present disclosure is to provide a low-loss arithmetic circuit, an operating method thereof, and a low-loss Processing-in-Memory circuit. By using the low-loss arithmetic circuit and/or the method and/or the low-loss Processing-in-Memory circuit, the quantization error may be significantly reduced while the loss may be significantly reduced.

In the first aspect of the present disclosure, this object is solved by a low-loss arithmetic circuit, including n arithmetic units ($AU_1$, $AU_2$, . . . $AU_n$), wherein n is an integer greater than 1, and each arithmetic unit ($AU_1$) including a first MOSFET, its gate being connected to the output signal ($W_1$) of the storage unit allocated to the arithmetic unit ($AU_1$), a first one of its drain and source being grounded, and a second one of its drain and source being connected to a first one of the drain and source of a second MOSFET; the second MOSFET, its gate being connected to a first input signal ($INL_1$) allocated to the arithmetic unit ($AU_1$), and a second one of its drain and source being connected to the output signal line (OUT) of the low-loss arithmetic circuit; a third MOSFET, its gate being connected to the inversion ($WB_1$) of the output signal of the storage unit allocated to the arithmetic unit ($AU_1$), a first one of its drain and source being grounded (GND), and a second one of its drain and sources being connected to a first one of the drain and source of a fourth MOSFET; and the fourth MOSFET, its gate being connected to the second input signal ($INR_1$) allocated to the arithmetic unit ($AU_1$), and a second one of its drain and source being connected to the output signal line (OUT); and a reset MOSFET, its gate being connected to a timing signal ($\varphi_{PRE}$), a first one of its drain and source being connected to the supply voltage (VDD), and a second one of its drain and source being connected to the output signal line (OUT).

In the present disclosure, the term "MOSFET" refers to a Metal-Oxide-Semiconductor Field-Effect Transistor (MOSFET). The term "inversion" refers to the digital signal result obtained after the digital signal is inverted (such as by an inverter). For example, the inversion of the signal "1" is "0", and the inversion of the signal "0" is "1".

In an beneficial embodiment of the present disclosure, it is provided that the first to fourth MOSFETs are n-type MOSFETs and the reset MOSFET is p-type MOSFET; or the first to fourth MOSFETs are p-type MOSFET and the reset MOSFETs are n-type MOSFETs.

In a preferred embodiment of the present disclosure, the level of the first input signal ($INI_1$) and/or the second input signal ($INR_1$) allocated to the arithmetic unit ($AU_1$) is set according to one or more of the followings; the second input signal ($INR_1$) is low level, and the low-loss arithmetic circuit is configured to perform a NAND operation of the output signal (W) and the first input signal ($INL_1$); the first input signal (INL) is low level, and the low-loss arithmetic circuit is configured to perform an OR operation of the output signal (W) and the inversion of second input signal ($INR_1$); and the first input signal ($INL_1$) is the inversion of the second input signal ($INR_1$), and the low-loss arithmetic circuit is configured to perform an XNOR operation of the output signal ($W_1$) and the second input signal ($INR_1$).

In beneficial embodiment of the present disclosure, it is provided that the reset MOSFET is connected in series with a resistor.

In a preferred embodiment of the present disclosure, it is provided that the low-loss arithmetic circuit includes a first arithmetic unit and a second arithmetic unit, wherein the level of the timing signal ($\varphi_{PRE}$) and the first input signal ($INL_1$, $INL_2$) and the second input signal ($INR_1$, $INR_2$) of the first and second arithmetic units are set such that in the first period of the first cycle, the reset MOSFET is turned on, so that an output node connected to the output signal line (OUT) is charged to a high level; in the second period of the first cycle, the reset MOSFET is turned off, and the second and fourth MOSFETs of the second arithmetic unit are turned off, and the first arithmetic unit performs the corresponding operation and outputs the first operation result to the output signal line (OUT); in the first period of the second cycle, the reset MOSFET is turned on, so that the output node connected to the output signal line (OUT) is charged to a high level; and in the second period of the second cycle, the reset MOSFET is turned off, and the second and fourth MOSFETs of the first arithmetic unit are turned off, and the second arithmetic unit performs the corresponding operation and outputs the second operation result to the output signal line (OUT).

In another preferred embodiment of the present disclosure, it is provided that each arithmetic unit is allocated a plurality of storage units, and each storage unit is configured to store 1-bit data, wherein the gate of the first MOSFET of the arithmetic unit is connected to the output signals ($W_1$) of the plurality of storage units allocated to the arithmetic unit, and the gate of the third MOSFET of the arithmetic unit is connected with the inversion ($WB_1$) of the output signals of the plurality of storage units allocated to the arithmetic unit ($AU_1$).

In the second aspect of the present disclosure, this object is solved by a low-loss Processing-in-Memory circuit, including n groups of storage units, each group of storage units being allocated to respective one of n arithmetic units and including one or more storage units, wherein n is an integer greater than 1; and n arithmetic units ($AU_1$, $AU_2$, . . . $AU_n$), wherein each arithmetic unit ($AU_1$) includes a first MOSFET, its gate being connected to an output signal (W1) of the storage unit of the storage unit group allocated to the arithmetic unit ($AU_1$), a first one of its drain and source grounded, a second one connected to a first one of the drain and source of a second MOSFET; the second MOSFET, its gate being connected to a first input signal ($INL_1$)

allocated to the arithmetic unit ($AU_1$), and a second one of its drain and source being connected to the output signal line (OUT) of the low-loss arithmetic circuit; a third MOSFET, its gate being connected to the inversion ($WB_1$) of the output signal of the storage unit of the storage unit group allocated to the arithmetic unit ($AU_1$), a first one of its drain and source being grounded (GND), and a second one of its drain and sources being connected to a first one of the drain and source of a fourth MOSFET; and the fourth MOSFET, its gate being connected to a second input signal (INRs) allocated to the arithmetic unit ($AU_1$), and a second one of its drain and source being connected to the output signal line (OUT); and a reset MOSFET, its gate being connected to the timing signal ($\varphi_{PRE}$), a first one of its drain and source being connected to the supply voltage (VDD), and a second one of its drain and source being connected to the output signal line (OUT).

In an beneficial embodiment of the present disclosure, it is provided that each arithmetic unit includes $2^k$ storage units, where k is an integer greater than 1.

In a preferred embodiment of the present disclosure, it is provided that the low-loss Processing-in-Memory circuit further includes a control circuit configured to control the level of the timing signal ($\varphi_{PRE}$) and the first input signal and the second input signal of each arithmetic unit, such that in the first period of the each cycle of the timing signal ($\varphi_{PRE}$), the reset MOSFET is turned on, so that the output node connected to the output signal line (OUT) is charged to a high level; and in the second period of each cycle, the reset MOSFET is turned off, and the i-th arithmetic unit ($AU_i$) performs the corresponding operation and outputs the operation result to the output signal line (OUT), and the second and fourth MOSFETs of the remaining arithmetic units ($AU_1, \ldots AU_{i-1}, AU_{i+1} \ldots AU_n$) are off, wherein i is an integer and $0<i\leq n$.

In an beneficial embodiment of the present disclosure, it is specified that the timing signal ($\varphi_{PRE}$) is low in the first time period and high in the second time period.

In a preferred embodiment of the present disclosure, the level of the first input signal ($INL_1$) and/or the second input signal ($INR_1$) allocated to each arithmetic unit ($AU_1$) is set to one or more of the following item: the second input signal (INR1) is low level, and the low-loss Processing-in-Memory circuit is configured to perform a NAND operation of the output signal ($W_1$) and the first input signal ($INL_1$); the first input signal (INL) is low level, and the low-loss Processing-in-Memory circuit is configured to perform an OR (OR) operation of the output signal (W) and the inversion of second input signal ($INR_1$); and the first input signal ($INL_1$) is the inversion of the second input signal ($INR_1$), and the low-loss Processing-in-Memory circuit is configured to perform an XNOR operation of the output signal ($W_1$) and the second input signal (INR1).

In the third aspect of the present disclosure, the aforementioned object is solved by a method for operating the low-loss arithmetic circuit according to the present disclosure, including the following steps: in the first period of the each cycle of the timing signal ($\varphi_{PRE}$), controlling the level of the timing signal ($\varphi_{PRE}$), such that the reset MOSFET is turned on, so that the output node connected to the output signal line (OUT) is charged to high level; and in the second period of each cycle, controlling the level of the timing signal ($\varphi_{PRE}$), such that the reset MOSFET is turned off, and controlling the level of the first input signal and the second input signal of each arithmetic unit, such that the i-th arithmetic unit ($AU_i$) performs the corresponding operation and outputs the operation result to the output signal line (OUT), and the second and fourth MOSFETs of the remaining arithmetic units ($AU_1, \ldots AU_{i-1}, AU_{i+1} \ldots AU_n$) are turned off, where i is an integer and $0<i\leq n$.

The present disclosure has at least the following advantages, (1) in the present disclosure, since the signals output by the memory may directly participate in the operation in the arithmetic unit without digital-to-analog conversion, and the result of the operation does not require analog-to-digital conversion, it may avoid the quantization error caused by the two analog-to-digital and digital-to-analog conversions, thereby improving the calculation precision; (2) the present disclosure allocates a corresponding time slot to each arithmetic unit through timing control, so that the calculation result of all the arithmetic units may be transmitted through one single output signal line, thereby avoiding the power loss caused by numerous output signal lines and avoiding the noise caused by these signal lines, and meanwhile reducing the wiring complexity and chip area.

BRIEF DESCRIPTION OF THE DRAWINGS

The present disclosure will be further explained below with reference to the drawings in conjunction with specific embodiments.

DETAILED DESCRIPTION

Figure 1:
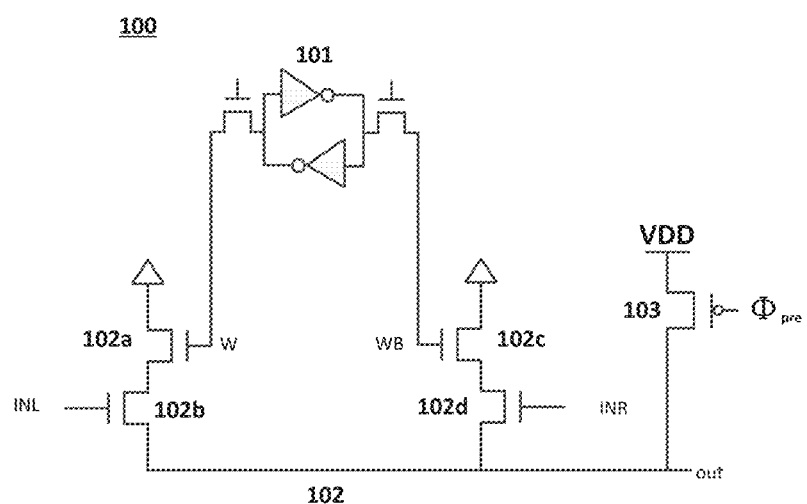
FIG. 1 shows a schematic diagram of the first embodiment of a low-loss Processing-in-Memory circuit according to the present disclosure.

It should be pointed out that, components in the drawings may be shown in an exaggerated form for the purpose of illustration, instead of being true to scale. In the drawings, same or functionally same components are provided with same reference numbers.

In the present disclosure, unless otherwise specified, "arranged on", "arranged above", and "arranged over" do not exclude the presence of intermediates between them. In addition, "arranged on or above" only means the relative positional relationship between two components, and under certain circumstances, such as by inverting the direction of the product it may also be converted to "arranged under or below", and vice versa.

In the present disclosure, each embodiment is only intended to illustrate the embodiment of the present disclosure, and should not be construed as limiting.

In the present disclosure, unless otherwise specified, the articles "a" and "an" do not exclude the scenario of multiple elements.

In the present disclosure, the term "connecting" may refer to the direct connecting, as well as the indirect connecting through an intermediate element.

It should also be noted that in the embodiments of the present disclosure, for clarity and simplicity, only a portion of the parts or components may be shown, but those of ordinary skill in the art may understand that under the teaching of the present disclosure, required parts or components may be added according to concrete scenarios. In addition, unless otherwise stated, the feature of the different embodiments of the disclosure may be combined with each other. For example, a feature in the second embodiment may be used to replace the corresponding or functionally identical or similar features of the first embodiment, and the resulting embodiment also falls within the scope of disclosure or record of the disclosure.

It should also be noted that within the scope of the present disclosure, the terms "same", "equal", "equal to" and other terms do not mean that the two values are absolutely equal, but allow certain reasonable errors, that is, these terms also encompass the meanings of "substantially the same", "substantially equal", and "substantially equal to". For the same reason, in the present disclosure, the terms "perpendicular to", "parallel to" and the like describing the direction also encompass the meanings of "substantially perpendicular to" and "substantially parallel to".

In addition, the numbers of the steps of methods of the present disclosure are not intended to limit the execution order of the method steps. Unless otherwise specified, the method steps may be performed in a different order.

First of all, the principle on which the disclosure is based is described. The existing in-memory calculation and processing schemes are generally divided into two ways: simulation signal processing and all-digital processing. The two processing ways are briefly described in the following: (1) the flow of simulation signal processing is as follows: first, the digital signal read by the memory is converted into an analog signal and input to the arithmetic unit for in-memory calculation based on the analog signal, and then the analog signal is converted into digital signal to output; in this process, the data is damaged due to the quantization error in the digital-to-analog and analog-to-digital conversion process, which may cause data errors; moreover, in the signal processing process, the noise introduced by quantization increases the degree of data damage; (2) all-digital processing means that the entire storage and calculation process is completely realized by digital signals, but its disadvantage is that the circuit area is limited by the wiring complexity of the numerous signals of traditional digital circuits, so the chip area is too large in the implementation process, and too many wires are more likely to introduce noise. In the present disclosure, the inventor at least partially overcomes the above technical problems by adopting the following technical means: in the present disclosure, a combination of field effect transistors is used to implement multiple logic operations, so the signal output by the memory may directly participate in the operation in the arithmetic unit without digital-to-analog conversion, and the result of the operation does not require analog-to-digital conversion, thereby avoiding the quantization error caused by the two analog-to-digital and digital-to-analog conversions, improving precision greatly; simultaneously, the present disclosure allocates a corresponding time slot to each arithmetic unit through timing control, so that the calculation result of all the arithmetic units may be transmitted through a single output signal line, thereby avoiding the power loss caused by numerous output signal lines and avoiding the noise caused by these signal lines, and reducing the wiring complexity and chip area.

The present disclosure will be further explained below with reference to the drawings in conjunction with specific embodiments.

FIG. 1 shows a schematic diagram of a first embodiment of a low-loss Processing-in-Memory circuit 100 according to the present disclosure.

As shown in FIG. 1, the low-loss Processing-in-Memory circuit 100 includes the following components.

n groups of storage units, each group storage units is allocated to one of n arithmetic units and includes one or more storage units, where n is an integer greater than 1. In this embodiment, n=1. However, in other embodiments, n may be selected to be greater than 1, for example, 2, 3, 4, 6, 8, ..., 100, and so on. In this embodiment, each storage unit includes two inverters and two MOSFETs, which are configured to store 1-bit data. However, in other embodiments, other forms of storage unit may be used.

n arithmetic units ($AU_1$, $AU_2$, .... $AU_n$), n is an integer greater than 1. In this embodiment, only one single arithmetic unit, that is, the arithmetic unit 102, is shown. The arithmetic unit 102 includes a first MOSFET 102a, its gate is connected to the output signal W of the storage unit 101 allocated to the arithmetic unit 102, the first one of its drain and source (for example, the source herein) is grounded, and the second one of its drain and source (for example, the drain herein) is connected to the first one of the drain and source (for example, the drain herein) of the second MOSFET 102b. In this embodiment, the first MOSFET 102a is an n-type MOSFET. The arithmetic unit 102 also includes the second MOSFET 102b, its gate is connected to the first input signal INL allocated to the arithmetic unit 102, and the second one of its drain and source (for example, the source herein) is connected to the output signal line OUT of the low-loss arithmetic circuit; In this embodiment, the second MOSFET 102b is an n-type MOSFET. The arithmetic unit 102 also includes a third MOSFET 102c, its gate is connected to the inversion WB of the output signal of the storage unit allocated to the arithmetic unit 102, the first one of its drain and source (for example, the source herein) is grounded (GND), and second of its drain and sources (for example, the drain herein) is connected to the first one of the drain and source (for example, the drain herein) of the fourth MOSFET. In this embodiment, the third MOSFET 102c is an n-type MOSFET. The arithmetic unit 102 further includes the fourth MOSFET 102d, its gate is connected to the second input signal (INR1) allocated to the arithmetic unit (AU1), and the second one of its drain and source (for example, the source herein) is connected to the output signal line (OUT). In this embodiment, the fourth MOSFET 102d is an n-type MOSFET.

A reset MOSFET 103, its gate is connected to the timing signal ($\varphi_{PRE}$), the first one of its drain and source (for example, the drain herein) is connected to the supply voltage VDD, and the second one of its drain and source (for example, the source herein) is connected to the output signal line (OUT). In this embodiment, the reset MOSFET 103 is a p-type MOSFET.

Here, by setting the levels of the first input signal INL and the second input signal INR, the following logical operations may be performed NAND operation: the second input signal INR is low level, the first input signal INL is one of operation data, and the output signal W is another operation data, wherein the low-loss Processing-in-Memory circuit 100 is configured to perform a NAND operation of the output signal W and the first input signal INL; OR operation: the first input signal INL is low level, the second input signal INR is one of the operation data, and the output signal W is another operation data, wherein the low-loss Processing-in-Memory circuit 100 is configured to perform an OR (OR) operation of the output signal W and the inversion of the second input signal INR; and XNOR operation: the first input signal INL is the inversion of the second input signal INR, the second input signal INR is one of the operation data, and the output signal W is another operation data, wherein the low-loss Processing-in-Memory circuit 100 is configured to perform an XNOR operation of the output signal W and the second input signal INR.

It can be seen from the above that the low-loss Processing-in-Memory circuit 100 of the present disclosure may perform a variety of logic operations without analog-to-digital or digital-to-analog conversion, and its circuit and configuration are simple, which may avoid at the greatest extent the quantization error and noise caused by analog-to-digital or digital-to-analog conversion.

Figure 2:
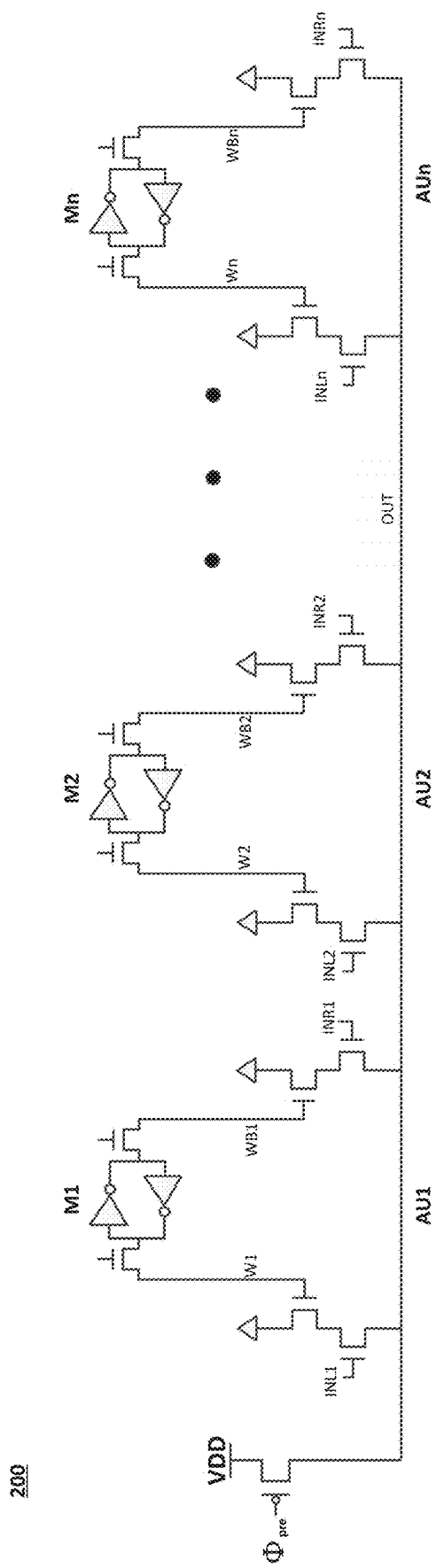
FIG. 2 shows a schematic diagram of the second embodiment of a low-loss Processing-in-Memory circuit according to the present disclosure.

FIG. 2 shows a schematic diagram of a second embodiment of a low-loss Processing-in-Memory circuit 200 according to the present disclosure.

The second embodiment of FIG. 2 differs from the first embodiment mainly in that, in the embodiment of FIG. 2, the low-loss Processing-in-Memory circuit 100 has a plurality of arithmetic units ($AU_1$, $AU_2$ ..., $AU_n$), and the storage unit groups ($M_1$, $M_2$, ... $M_n$) allocated to each arithmetic unit ($AU_1$, $AU_2$, ... $AU_n$) have a single storage unit, respectively, and each storage unit stores 1 bit data.

It can be seen here that the output signals of all arithmetic units are connected with a single output signal line OUT.

Figure 3:
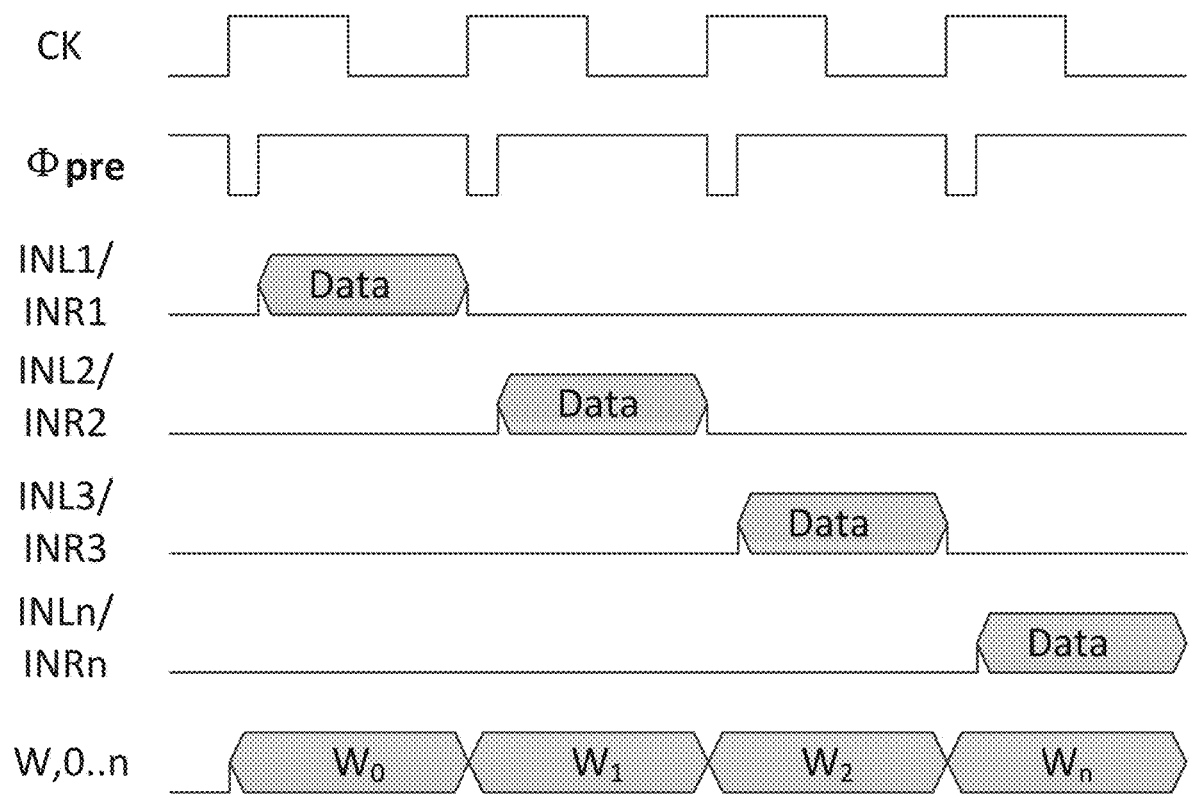
FIG. 3 shows a timing diagram of the low-loss Processing-in-Memory circuit according to the present disclosure.

FIG. 3 shows a timing diagram of the low-loss Processing-in-Memory circuit according to the present disclosure.

In FIG. 3, CK is a clock pulse signal. The period of the timing signal $\varphi_{PRE}$ may, for example, make reference to the period of the clock pulse signal CK (referred to as the clock period), for example, an integer multiple of the clock period, such as 1 time, 2 times, or 3 times. The level of the timing signal $\varphi_{PRE}$ and the levels of the first input signal and the second input signal of each arithmetic unit are set as follows: in the first period of the each cycle of the timing signal $\varphi_{PRE}$, the timing signal ($\varphi_{PRE}$) is low level, the reset MOSFET is turned on, so that the output node connected to the output signal line OUT is charged to a high level. At this stage, the data on the output data line may be cleared or reset. In the second time period of each cycle, the timing signal $\varphi_{PRE}$ is high level, the reset MOSFET is turned off, and the first and second input signals ($INL_i$, $INR_i$) of the i-th arithmetic unit ($AU_i$) respectively input corresponding data to perform the corresponding calculation and output the calculation result to the output signal line (OUT), where i is an integer and $0<i\leq n$, and for example, the first and the second input signal of the remaining arithmetic units ($AU_1$, ... $AU_{i+1}$, $AU_{i+1}$ ... $AU_n$) are set to low level, so that their second and fourth MOSFETs are turned off, therefore in the second time period the remaining arithmetic units ($AU_1$, ... $AU_{i-1}$, $AU_{i+1}$, ... $AU_n$) have no data to output, but only the data of the i-th arithmetic unit ($AU_i$) is output to the output data line OUT. Repeatedly, in each cycle of the timing signal $\varphi_{PRE}$, different arithmetic units may perform operations and output the output results of the arithmetic units to the output data line OUT, so all the arithmetic units share a single output data line OUT, thus reducing the number of wiring, thereby reducing loss and interference.

Figure 4:
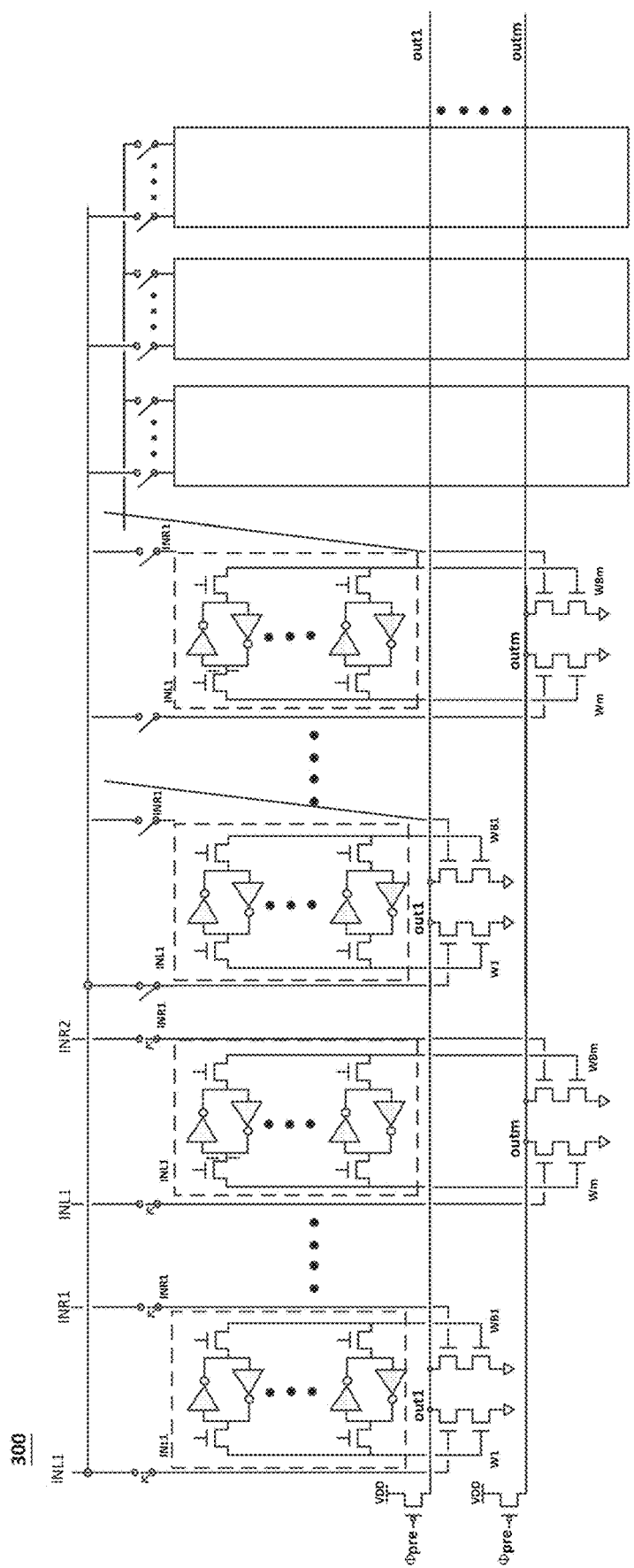
FIG. 4 shows a schematic diagram of the third embodiment of a low-loss Processing-in-Memory circuit according to the present disclosure.

FIG. 4 shows a schematic diagram of a third embodiment of a low-loss Processing-in-Memory circuit 300 according to the present disclosure.

The main difference between the third embodiment of FIG. 4 and the first embodiment is that, in the embodiment of FIG. 4, the storage unit group (see the dashed box in the figure) allocated to each arithmetic unit has a plurality of storage units, for example, 16 storage units herein. Each storage unit is configured to store 1-bit data. The gate of the first MOSFET of each arithmetic unit is connected to the output signal $W_1$ of the plurality of storage units allocated to the arithmetic unit, and the gate of the third MOSFET of the arithmetic unit is connected with the inversion $WB_1$ of the output signals of the plurality storage units allocated to the arithmetic unit. In addition, the low-loss Processing-in-Memory circuit 300 has m output signal lines ($OUT_1$, $OUT_2$, ... $OUT_m$), and m is an integer greater than 1. In addition, each output signal line ($OUT_1$, $OUT_2$, ... $OUT_m$) is respectively connected to n arithmetic units (for example, 16) and a reset MOSFET to reset the output signal line ($OUT_1$, $OUT_2$ ... $OUT_m$).

In this embodiment, each arithmetic unit may read data of the plurality storage units, for example, may read data from each of 16 storage units and apply it to corresponding calculations. The output of the data of the storage unit may be controlled by, for example, the control terminal of the storage unit, for example, the on and off of two MOSFETs. At the same time, the m×n arithmetic units in FIG. 4 only require m output signal lines, thereby greatly reducing the number of signal lines.

Figure 5:
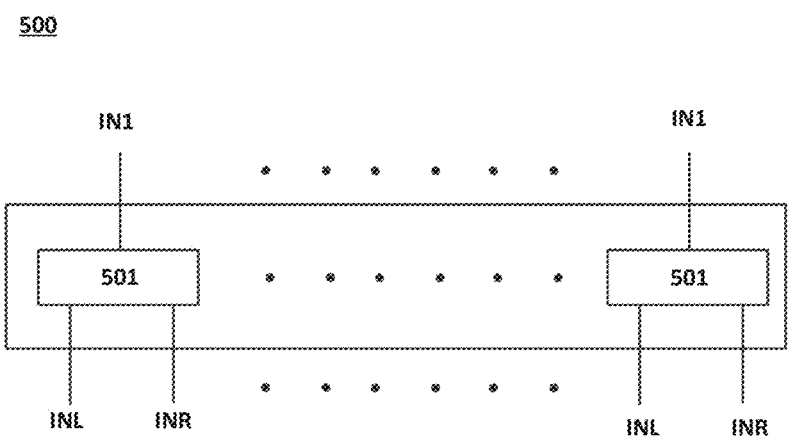
FIG. 5 shows the input signal generating device of the low-loss Processing-in-Memory circuit according to the present disclosure.

FIG. 5 shows the input signal generating device 500 of the low-loss Processing-in-Memory circuit according to the present disclosure.

As shown in FIG. 5, the input signal generating device 500 is configured to generate the first input signal INL and the second input signal INR of each arithmetic unit according to the input signal ($IN_1$). For example, the input signal generating device 500 may be a decoder. The input signal generating device 500 may be a decoder and may include a plurality of generating units 501, and each generating unit 501 is used for generating the first and second input signals of a single arithmetic unit. In other embodiments, the input signal generating device 500 may be a decoder and may include a single generating unit 501, which is configured to generate the first and second input signals for all arithmetic units.

Although some embodiments of the disclosure are described in the present disclosure document, those skilled in the art may understand that these embodiments are shown merely as examples. Under the teachings of the disclosure, various variations, alternatives and modifications are conceivable to those skilled in the art. The appended claims are intended to define the scope of the disclosure and hereby encompass the claims themselves and equivalent methods and structures.

What is claimed is:

1. A low-loss arithmetic circuit, comprising:
 a plurality of arithmetic each comprising:
  a first metal-oxide-semiconductor field-effect transistor (MOSFET), a second MOSFET, a third MOSFET, and a fourth MOSFET,
   wherein the first MOSFET includes a gate connected to an output signal ($W_1$) of a storage unit allocated to an arithmetic unit of the plurality of arithmetic units, a first one of a drain or source of the first MOSFET is grounded, and a second one of the drain or source of the first MOSFET is connected to a first one of a drain or source of the second MOSFET,
   wherein the second MOSFET includes a gate connected to a first input signal ($INL_4$) allocated to the arithmetic unit, and a second one of the drain or source of the second MOSFET is connected to an output signal line (OUT) of the low-loss arithmetic circuit, wherein the third MOSFET includes a gate connected to an inversion ($WB_1$) of the output signal of the storage unit allocated to the arithmetic unit, a first one of a drain or source of the third MOSFET is grounded (GND), and a second one of the drain or source of the third MOSFET is connected to a first one of a drain or source of the fourth MOSFET, and wherein the fourth MOSFET includes a gate connected to a second input signal ($INR_1$) allocated to the arithmetic unit, and a second one of the drain or source of the fourth MOSFET is connected to the output signal lire (OUT); and a reset MOSFET, wherein a gate of the reset MOSFET is connected to a tuning signal ($\varphi_{PRE}$), wherein a first one of a drain or source of the reset MOSFET is connected to a supply voltage (VDD), wherein a second one of the drain or source of the reset MOSFET is connected to the output signal line (OUT), and wherein the reset MOSFET is connected in series with a resistor.

2. The low-loss arithmetic circuit according to claim 1, wherein:

the first MOSFET, the second MOSFET, the third MOSFET, and the fourth MOSFET are n-type MOSFETs and the reset MOSFET is a p-type MOSFET; or the first MOSFET, the second MOSFET, the third MOSFET, and the fourth MOSFET are p-type MOSFETs and the reset MOSFET is an n-type MOSFET.

3. The low-loss arithmetic circuit according to claim 1, wherein:

when the second input signal ($INR_1$) is low level the low-loss arithmetic circuit is configured to perform a NAND operation of an output signal ($W_1$) and the first input signal ($INL_1$), when the first input signal ($INL_1$) is low level the low-loss arithmetic circuit is configured to perform an OR (OR) operation of the output signal ($W_1$) and the inversion of the second input signal ($INR_1$), and when the first input signal ($INL_1$) is the inversion of the second input signal ($INR_1$) the low-loss arithmetic circuit is configured to perform an XNOR operation of the output signal ($W_1$) and the second input signal ($INR_1$).

4. The low-loss arithmetic circuit according to claim 1, wherein:

the plurality of arithmetic units include a first arithmetic unit and a second arithmetic unit, and a level of the timing signal ($\varphi_{PRE}$) and a first input signal ($INL_1$, $INL_2$) and a second input signal ($INR_1$, $INR_2$) of the first arithmetic unit and the second arithmetic unit are set such that:

in a first period of a first cycle, the reset MOSFET is turned on, so that an output node connected to the output signal line (OUT) is charged to high level;

inn a second period of the first cycle, the reset MOSFET is turned off, and the second MOSFET and the fourth MOSFET of the second arithmetic unit are turned off, and the first arithmetic unit performs a corresponding operation and outputs a first operation result to the output signal line (OUT);

in a first period of a second cycle, the reset MOSFET is turned on, so that the output node connected to the output signal line (OUT) is charged to a high level; and in a second period of the second cycle, the reset MOSFET is turned off, and the second MOSFET and the fourth MOSFET of the first arithmetic unit are turned off, and the second arithmetic unit performs a corresponding operation and outputs a second operation result to the output signal line (OUT).

5. The low-loss arithmetic circuit according to claim 1, wherein:

each of the plurality of arithmetic units is allocated a plurality of storage units, each storage unit is configured to store 1-bit data, the gate of the first MOSFET of the arithmetic unit is connected to the output signals ($W_1$) of the plurality storage units allocated to the arithmetic unit, and the gate of the third MOSFET of the arithmetic unit is connected with the inversion ($WB_1$) of the output signals of the plurality storage units allocated to the arithmetic unit.

6. A low-loss Processing-in-Memory circuit, comprising:

a plurality of storage unit groups, each of the plurality of storage unit groups including one or more storage units; and a plurality of arithmetic units each comprising:

a first metal-oxide-semiconductor field-effect transistor (MOSFET), a second MOSFET, a third MOSFET, and a fourth MOSFET, wherein the first MOSFET includes a gate connected to an output signal ($W_1$) of a storage unit of a storage unit group allocated to the arithmetic unit, a first one of a drain or source of the first MOSFET is grounded, and a second one of the drain or source of the first MOSFET is connected to a first one of a drain or source of the second MOSFET, wherein the second MOSFET includes a gate connected to a first input signal ($INL_1$) allocated to the arithmetic unit, and a second one of the drain or source of the second MOSFET is connected to an output signal line (OUT) of the low-loss Processing-in-Memory circuit, wherein the third MOSFET includes a gate connected to an inversion ($WB_1$) of the output signal of a storage unit of the storage unit group allocated to the arithmetic unit, a first one of a drain or source of the third MOSFET is grounded (GND), and a second one of the drain or source of the third MOSFET is connected to a first one of a drain or source of the fourth MOSFET, and wherein the fourth MOSFET includes a gate connected to a second input signal ($INR_1$) allocated to the arithmetic unit, and a second one of the drain or source of the fourth MOSFET is connected to the output signal line (OUT), and wherein each arithmetic unit includes $2^k$ storage units, where k is an integer greater than 1; and a reset MOSFET, wherein the reset MOSFET includes a gate connected to a timing signal ($\varphi_{PRE}$), wherein a first one of a drain or source of the reset MOSFET is connected to a supply voltage (VDD), and wherein a second one of the drain or source of the reset MOSFET is connected to the output signal line (OUT).

7. The low-loss Processing-in-Memory circuit according to claim 6, further comprising:
a control circuit configured to control the level of the timing signal ($\varphi_{PRE}$) and the first input signal and the second input signal of each arithmetic unit, such that:
in a first period of each cycle of the timing signal ($\varphi_{PRE}$), the reset MOSFET is turned on, so that an output node connected to the output signal line (OUT) is charged to a high level; and
in a second period of each cycle, the reset MOSFET is turned off, and an i-th arithmetic unit of the plurality of arithmetic units performs a corresponding operation and outputs an operation result to the output signal line (OUT), and the second MOSFET and the fourth MOSFET of remaining arithmetic units of the plurality of arithmetic units fourth MOSFETS of remaining arithmetic units of the plurality of arithmetic units are turned off, where i is an integer and 0<i≤n.

8. The low-loss Processing-in-Memory circuit according to claim 7, wherein the timing signal ($\varphi_{PRE}$) is low in the first period and high in the second period.

9. The low-loss Processing-in-Memory circuit according to claim 6, wherein the level of the first input signal ($INL_1$) or the second input signal ($INR_1$) allocated to the arithmetic unit is set such that one or more of the following occur:
when the second input signal ($INR_1$) is low level the low-loss Processing-in-Memory circuit is configured to perform a NAND operation of an output signal (W) and the first input signal ($INL_1$);
when the first input signal (INL) is low level, the low-loss Processing-in-Memory circuit is configured to perform an OR (OR) operation of the output signal (W) and the inversion of the second input signal ($INR_1$); and
when the first input signal ($INL_1$) is the inverse of the second input signal ($INR_1$), the low-loss Processing-in-Memory circuit is configured to perform an XNOR operation of an output signal ($W_1$) and the second input signal ($INR_1$).

10. A method for operating a low-loss arithmetic circuit, comprising:
in a first period of each cycle of a timing signal ($\varphi_{PRE}$), controlling a level of a timing signal ($\varphi_{PRE}$), such that a reset MOSFET is turned on, so that an output node connected to an output signal line (OUT) is charged to a high level; and
in a second period of each cycle, controlling the level of the timing signal ($\varphi_{PRE}$), such that the reset MOSFET is turned off, and controlling levels of a first input signal and a second input signal of each arithmetic unit of a plurality of arithmetic units, such that an i-th arithmetic unit of the plurality of arithmetic units performs a corresponding operation and outputs an operation result to the output signal line (OUT), and a second metal-oxide-semiconductor field-effect transistor (MOSFET) and a fourth MOSFET of remaining arithmetic units of the plurality of arithmetic units are turned off, where i is an integer and 0<i≤n, wherein the low-loss arithmetic circuit comprises:
the plurality of arithmetic units each comprise:
a first MOSFET, the second MOSFET, a third MOSFET, and a fourth MOSFET,
wherein the first MOSFET includes a gate connected to an output signal ($W_1$) of a storage unit coupled and allocated to an arithmetic unit of the plurality of arithmetic units, a first one of a drain or source of the first MOSFET is grounded, and a second one of the drain or source of the first MOSFET is connected to a first one of a drain or source of the second MOSFET,
wherein the second MOSFET includes a gate connected to a first input signal ($INL_1$) allocated to the arithmetic unit, and a second one of the drain or source of the second MOSFET is connected to an output signal line (OUT) of the low-loss arithmetic circuit,
wherein the third MOSFET includes a gate connected to an inversion ($WB_1$) of the output signal of the storage unit coupled and allocated to the arithmetic unit, a first one of a drain or source of the third MOSFET is grounded (GND), and a second one of the drain or source of the third MOSFET is connected to a first one of a drain or source of the fourth MOSFET, and
wherein the fourth MOSFET includes a gate connected to a second input signal ($INR_1$) allocated to the arithmetic unit, and a second one of the drain or source of the fourth MOSFET is connected to the output signal line (OUT); and
a reset MOSFET,
wherein a gate of the reset MOSFET is connected to a timing signal ($\varphi_{PRE}$),
wherein a first one of a drain or source of the reset MOSFET is connected to a supply voltage (VDD), and
wherein a second one of the drain or source of the reset MOSFET is connected to the output signal line (OUT).

11. The method according to claim 10, wherein the timing signal ($\varphi_{PRE}$) is low in the first period and high in the second period.

12. The method according to claim 10, further comprising:
setting the level of the first input signal ($INL_1$) or the second input signal ($INR_1$) allocated to the arithmetic unit such that one or more of the following occur:
when the second input signal ($INR_1$) is low level, performing a NAND operation of an output signal (W) and the first input signal ($INL_1$);
when the first input signal (INL) is low level, performing an OR (OR) operation of the output signal (W) and an inversion of the second input signal ($INR_1$); and
when the first input signal ($INL_1$) is an inverse of the second input signal ($INR_1$), performing an XNOR operation of an output signal ($W_1$) and the second input signal ($INR_1$).

* * * * *